United States Patent
Isoda (10) Patent No.: US 6,833,739 B2
(45) Date of Patent: Dec. 21, 2004

(54) INPUT BUFFER CIRCUIT FOR SEMICONDUCTOR DEVICE

(75) Inventor: Masahito Isoda, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/811,456

(22) Filed: Mar. 20, 2001

(65) Prior Publication Data

US 2001/0011911 A1 Aug. 9, 2001

Related U.S. Application Data

(62) Division of application No. 09/479,927, filed on Jan. 10, 2000, now abandoned.

(30) Foreign Application Priority Data

Jan. 25, 1999 (JP) .......................... 11-016159

(51) Int. Cl.[7] ................................ H03B 1/00
(52) U.S. Cl. .................... 327/108; 327/408; 326/83
(58) Field of Search ................. 327/403, 407, 327/408, 563, 63–65, 112, 108, 50, 52, 28–30, 562, 70, 409–413; 326/26, 27, 56–58, 82, 83, 87, 86

(56) References Cited

U.S. PATENT DOCUMENTS

| | | | | |
|---|---|---|---|---|
| 5,166,558 A | * | 11/1992 | Ohsawa | 326/83 |
| 5,563,835 A | * | 10/1996 | Oldham | 327/52 |
| 5,621,340 A | | 4/1997 | Lee et al. | 327/65 |
| 5,739,700 A | | 4/1998 | Martin | 326/80 |
| 5,751,186 A | * | 5/1998 | Nakao | 327/562 |
| 5,789,948 A | * | 8/1998 | Kim et al. | 327/55 |
| 5,811,992 A | * | 9/1998 | D'Souza | 326/58 |
| 5,889,419 A | * | 3/1999 | Fischer et al. | 327/70 |
| RE36,179 E | | 4/1999 | Shimoda | 327/407 |
| 5,920,208 A | * | 7/1999 | Park | 327/52 |
| 5,929,655 A | * | 7/1999 | Roe et al. | 326/82 |
| 5,929,668 A | * | 7/1999 | Kim | 327/112 |
| 5,949,252 A | | 9/1999 | Taguchi | 326/86 |
| 5,949,452 A | * | 9/1999 | Jones | 326/87 |
| 5,994,922 A | | 11/1999 | Aoki et al. | 326/87 |
| 6,023,175 A | * | 2/2000 | Nunomiya et al. | 327/407 |
| 6,111,437 A | | 8/2000 | Patel | 327/74 |
| 6,194,933 B1 | * | 2/2001 | Ishino et al. | 327/163 |

FOREIGN PATENT DOCUMENTS

JP    2-073719    3/1990

* cited by examiner

Primary Examiner—Long Nguyen
(74) Attorney, Agent, or Firm—Arent Fox, PLLC (57) ABSTRACT

An input buffer circuit includes a differential amplifier that receives a input signal and its complement and generates an amplified signal corresponding to the voltage difference between the input signal and its complement. A transfer circuit receives the input signal and generates a transfer signal having the same logical value as the input signal. A control circuit connected to the differential amplifier and the transfer circuit selects one of the amplified signal and the transfer signal for output by enabling either the differential circuit or the transfer circuit.

41 Claims, 5 Drawing Sheets

INPUT BUFFER CIRCUIT FOR SEMICONDUCTOR DEVICE

This is a Division of Application Ser. No. 09/479,927 filed Jan. 10, 2000, now abandoned, entitled, "IMPROVED INPUT BUFFER CIRCUIT FOR SEMICONDUCTOR DEVICE."

BACKGROUND OF THE INVENTION

The present invention relates to an input buffer circuit of a semiconductor integrated circuit device, and, more particularly, to an input buffer circuit which receives a small amplitude signal.

Figure 1:
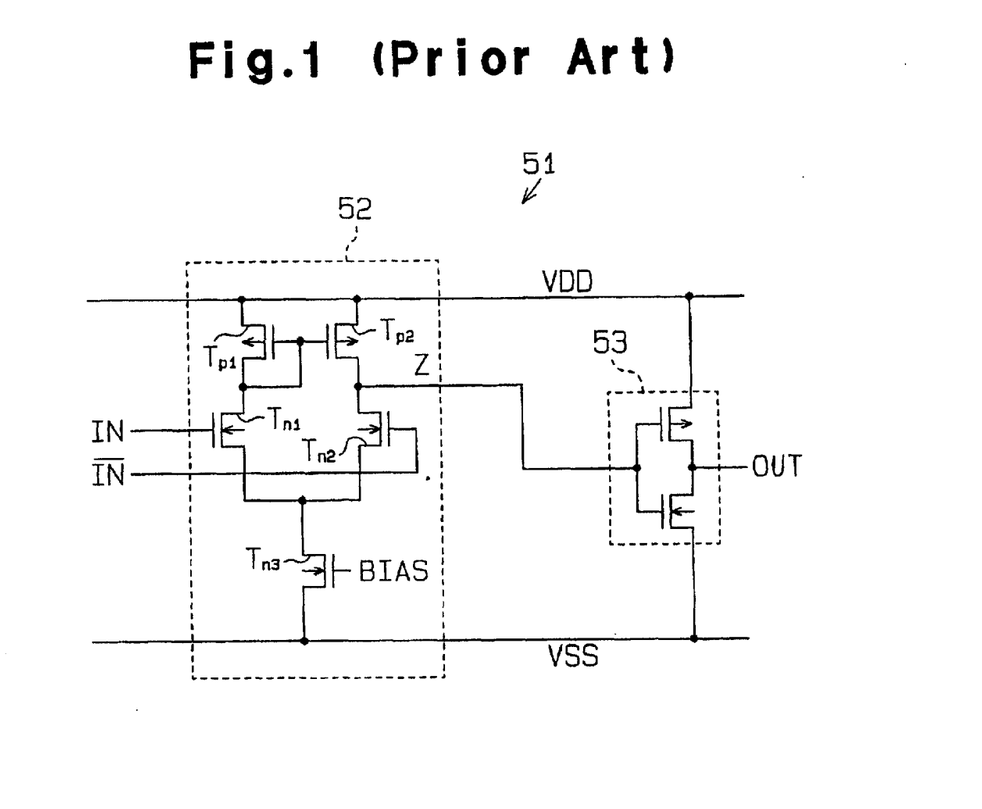
FIG. 1 is a circuit diagram of a conventional input buffer circuit.

As shown in FIG. 1, a conventional input buffer circuit 51 of a semiconductor integrated circuit includes a differential amplifier circuit 52 and a driver circuit 53.

The differential amplifier circuit 52, which is of a current mirror type, has P channel MOS (PMOS) transistors Tp1 and Tp2, N channel MOS (NMOS) transistors Tn1 and Tn2 and an NMOS transistor Tn3. The PMOS transistors Tp1 and Tp2 form a current mirror section, the NMOS transistors Tn1 and Tn2 form a differential amplifier section and the NMOS transistor Tn3 forms a constant current section.

The sources of the NMOS transistors Tn1 and Tn2 are connected together and to a low-potential power supply VSS via the NMOS transistor Tn3. A bias voltage BIAS is applied to the gate of the NMOS transistor Tn3. The drain of the NMOS transistor Tn1 is connected to a high-potential power supply VDD via the PMOS transistor Tp1. The drain of the NMOS transistor Tn2 is connected to the high-potential power supply VDD via the PMOS transistor Tp2. The gates of the PMOS transistors Tp1 and Tp2 are connected together and to the drain of the NMOS transistor Tn1. The drain of the NMOS transistor Tn2 is connected to the driver circuit 53.

The driver circuit 53 includes an inverter circuit comprising CMOS transistors. The driver circuit 53 provides internal circuits (not shown) of the semiconductor integrated circuit with an output signal OUT corresponding to a signal Z output from the node between the PMOS transistor Tp2 and the NMOS transistor Tn2.

An input signal IN is applied to the gate of the NMOS transistor Tn1, and a signal /IN which is a complementary signal of the input signal IN is applied to the gate of the NMOS transistor Tn2. The differential amplifier circuit 52 amplifies a potential difference between the input signals IN and /IN and supplies the signal Z to the driver circuit 53. The amplified signal Z is supplied via the driver circuit 53 to the internal circuits of the semiconductor integrated circuit as an output signal OUT.

The input buffer circuit 51 generates the output signal OUT having a full amplitude in response to the input signals IN and /IN both having small amplitudes and high-frequency.

Integrated circuits are designed to be used in a variety of ways (different environmental conditions) in order to reduce the development cost. The operational speed of semiconductor integrated circuits is ever increasing. Accordingly, attempts are being made to increase the speed of signals transferred between integrated circuits mounted on a board. The interface which uses a full-amplitude signal employs an input buffer circuit including a differential amplifier circuit in order to permit transfer of a small-amplitude signal (high-frequency signal). When the input signals IN and /IN have small amplitudes, therefore, it is necessary to employ the input buffer circuit 51 having the differential amplifier circuit 52. In other words, when the input signals IN and /IN have small amplitudes, it is not possible to employ an input buffer circuit that uses a CMOS transistor type inverter circuit.

However, even if a full-amplitude output signal OUT (i.e., the amplifying operation of the differential amplifier circuit 52) is unnecessary, the differential amplifier circuit 52 always operates and a constant current flows through the differential amplifier circuit 52. This unfortunately increases the power dissipation.

SUMMARY OF THE INVENTION

Accordingly, it is an object of the present invention to provide an input buffer circuit with reduced power dissipation.

One aspect of the present invention provides an input buffer circuit which includes a differential amplifier circuit for receiving first and second input signals and generating an amplified signal corresponding to a voltage difference between the first and second input signals. A transfer circuit receives the first input signal and outputs a transfer circuit output signal having the same logical level as the first input signal. A control circuit is connected to the differential amplifier circuit and the transfer circuit and selectively enables the differential amplifier circuit and the transfer circuit in accordance with a control signal.

Another aspect of the present invention provides an input buffer circuit which includes a differential amplifier circuit for receiving first and second input signals and generating an amplified signal corresponding to a voltage difference between the first and second input signals. A first tri-state inverter circuit is connected to the differential amplifier circuit and receives the amplified signal from the differential amplifier circuit. A second tri-state inverter circuit receives the first input signal. A control circuit is connected to the differential amplifier circuit and the first and second tri-state inverter circuits and selectively enables the differential amplifier circuit and the first and second tri-state inverter circuits in accordance with a control signal.

Yet another aspect of the present invention provides a method of testing a semiconductor device. The semiconductor device includes an output buffer connected between an internal logic circuit and a device pad, and an input buffer connected between the internal logic circuit and the device pad. The input buffer includes a differential amplifier circuit for selectively amplifying an input signal thereto and a transfer circuit. First, a terminal resistor is connected between the device pad and a high potential power supply. Then, the input signal is supplied to the input buffer from the output buffer. The differential amplifier circuit of the input buffer generates an amplified input signal and the transfer circuit of the input buffer generates a transfer signal having the same logic level as the input signal. A control signal is provided to the input buffer to enable the differential amplifier circuit and disable the transfer circuit.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

First Embodiment

Figure 2:
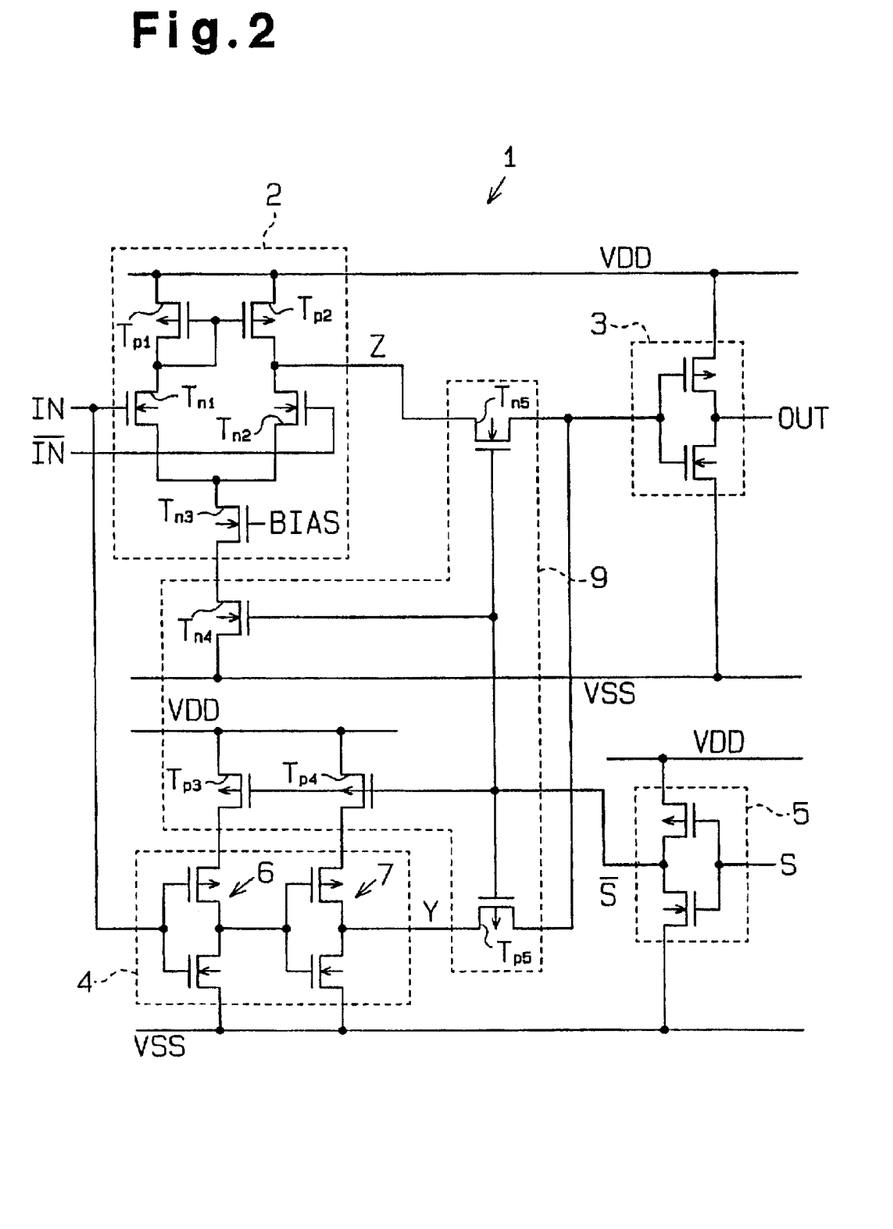
FIG. 2 is a circuit diagram of an input buffer circuit according to a first embodiment of the present invention.

Referring to FIG. 2, an input buffer circuit 1 according to a first embodiment of the present invention will be described. The input buffer circuit 1 has a differential amplifier circuit 2, a driver circuit 3, a transfer circuit 4, a control-signal output circuit 5 and a control circuit 9. The differential amplifier circuit 2 is enabled when the input signals IN and /IN have small amplitudes and disabled when the input signals IN and /IN have full amplitudes. As used herein, a full amplitude refers to about 1.2 V or more voltage range signal and a small amplitude refers to a signal having about 0.3V to about 1.2V. In other words, an input signal having a full amplitude cen be used as an interface signal in the TTL standard or the CMOS standard of the JEDEC standard and an input signal having a small amplitude is difficult to use as an interface signal in the above standards.

The differential amplifier circuit 2 and the driver circuit 3 respectively have the same structures as the differential amplifier circuit 52 and the driver circuit 53 of FIG. 1. The control circuit 9 includes NMOS transistors Tn4 and Tn5 and PMOS transistors Tp3–Tp5. The NMOS transistor Tn4 is connected between the NMOS transistor Tn3 of the amplifier circuit 2 and a low-potential power supply VSS. The NMOS transistor Tn5 is connected between the output terminal of the differential amplifier circuit 2 (the drain of the NMOS transistor Tn2) and the driver circuit 3. The gates of the NMOS transistors Tn4 and Tn5 are connected together.

The NMOS transistors Tn4 and Tn5 are turned on or off in response to the signal supplied to their gates. When the NMOS transistor Tn4 is turned on, a constant current flows through the NMOS transistor Tn3. The differential amplifier circuit 2 is therefore enabled when the NMOS transistor Tn4 is turned on. The differential amplifier circuit 2 provides the driver circuit 3 with a signal Z, generated by amplifying a potential difference between the input signals IN and /IN, via the NMOS transistor Tn5 when the NMOS transistor Tn5 is turned on.

The transfer circuit 4 includes series-connected inverter circuits 6 and 7 each of which comprises CMOS transistors. The high-potential power supply terminals of the inverter circuits 6 and 7 are connected to the high-potential power supply VDD via PMOS transistors Tp3 and Tp4, respectively. The low-potential power supply terminals of the inverter circuits 6 and 7 are connected to the low-potential power supply VSS.

The input signal IN is supplied to the input terminal of the transfer circuit 4 (the input terminal of the inverter circuit 6). The output terminal of the transfer circuit 4 (the output terminal of the inverter circuit 7) is connected via the PMOS transistor Tp5 to the driver circuit 3. Therefore, the transfer circuit 4 is enabled when the PMOS transistors Tp3 and Tp4 are turned on, and provides the driver circuit 3 with a signal Y, which is the same logic level as the input signal IN, via the PMOS transistor Tp5 when the PMOS transistor Tp5 is turned on. The PMOS transistor Tp5 and the NMOS transistor Tn5 form an output selecting circuit.

The control-signal output circuit 5 is an inverter circuit comprising CMOS transistors. When receiving an input control signal S from an external circuit, the control-signal output circuit 5 provides the gates of the NMOS transistors Tn4 and Tn5 and the PMOS transistors Tp3–Tp5 with the inverted signal (control signal /S) of the input control signal S. When the input signals IN and /IN have small amplitudes, the input control signal S is set to an L level. The "small amplitude" is such a low amplitude that the inverter circuits 6, 7, each of which comprise CMOS transistors and receive power-from the high-potential power supply VDD and low-potential power supply VSS, do not perform an inverting operation even upon reception of the input signal IN.

The operation of the input buffer circuit 1 will now be discussed.

When the input signals IN and /IN have small amplitudes, the control-signal output circuit 5 receives the input control signal S low. Then, the control-signal output circuit 5 sends the control signal /S high to the NMOS transistors Tn4 and Tn5 and the PMOS transistors Tp3–Tp5. As a result, the NMOS transistors Tn4 and Tn5 are turned on, and the PMOS transistors Tp3–Tp5 are turned off. Then, the differential amplifier circuit 2 is enabled in response to the ON action of the NMOS transistor Tn4. The differential amplifier circuit 2 amplifies the potential difference between the input signals IN and /IN to generate the signal Z and supplies this signal Z to the driver circuit 3 via the NMOS transistor Tn5. The transfer circuit 4 is disabled in response to the OFF actions of the PMOS transistors Tp3 and Tp4. When the PMOS transistor Tp5 is turned off, the output terminal of the transfer circuit 4 is electrically disconnected from the driver circuit 3.

As a result, the driver circuit 3 provides the internal circuits of an integrated circuit with an output signal OUT corresponding to the signal Z provided from the differential amplifier circuit 2. As the input buffer circuit 1 performs an input operation on the small-amplitude input signals IN and /IN, it is suitable for high-frequency input signals.

When the input signal IN has a full amplitude, the input control signal S high is supplied to the control-signal output circuit 5. At this time, the amplitude of the input control signal S is set to a range in which the inverter circuit 5 can perform an inverting operation in response to the input signals.

Then, the control-signal output circuit 5 sends the control signal /S low to the NMOS transistors Tn4 and Tn5 and the PMOS transistors Tp3–Tp5. This turns off the NMOS transistors Tn4 and Tn5 and turns on the PMOS transistors Tp3–Tp5. In response to the ON actions of the PMOS transistors Tp3 and Tp4, the transfer circuit 4 is enabled, causing the signal Y to be generated from the input signal IN via the inverter circuits 6 and 7. The signal Y is supplied via the PMOS transistor Tp5 to the driver circuit 3. By the OFF action of the NMOS transistor Tn4, the differential amplifier circuit 2 is disabled. When the NMOS transistor Tn5 is turned off, the output terminal of the differential amplifier circuit 2 is electrically disconnected from the driver circuit 3. Therefore, the driver circuit 3 provides the internal circuits of the integrated circuit with the output signal OUT corresponding to the signal Y from the transfer circuit 4. Thus, the input buffer circuit 1 performs an input operation on the input signal IN having a full amplitude.

As apparent from the foregoing description, the input buffer circuit 1 according to the first embodiment has the following advantages.

When the input signals IN and /IN have small amplitudes, the differential amplifier circuit 2 is enabled and the transfer circuit 4 is disabled in response to the H-level control signal /S. As a result, the potential difference between the small-amplitude input signals IN and /IN is amplified by the differential amplifier circuit 2 and is then supplied to the driver circuit 3. In this case, the consumed power of the input buffer circuit 1 is substantially the same as that of the prior art.

When the input signals IN and /IN have full amplitudes, the transfer circuit 4 is enabled and the differential amplifier circuit 2 is disabled by the low control signal /S. As a result, the input signal IN is supplied to the driver circuit 3 via the inverter circuits 6 and 7. Since the differential amplifier circuit 2 is disabled at this time, no constant current flows through the NMOS transistor Tn3, causing substantially no power to be consumed. This significantly reduces the consumed power of the input buffer circuit 1.

When the signal Z from the differential amplifier circuit 2 is supplied to the driver circuit 3, the transfer circuit 4 is electrically disconnected from the driver circuit 3. When the signal Y from the transfer circuit 4 is supplied to the driver circuit 3, the differential amplifier circuit 2 is electrically disconnected from the driver circuit 3. This prevents the disabled differential amplifier circuit 2 or transfer circuit 4 from adversely affecting the input signal to the driver circuit 3.

The driver circuit 3 is common to the differential amplifier circuit 2 and the transfer circuit 4 to cope with both the signals Y and Z. This prevents an increase in the circuit scale of the input buffer circuit 1.

Second Embodiment

Figure 3:
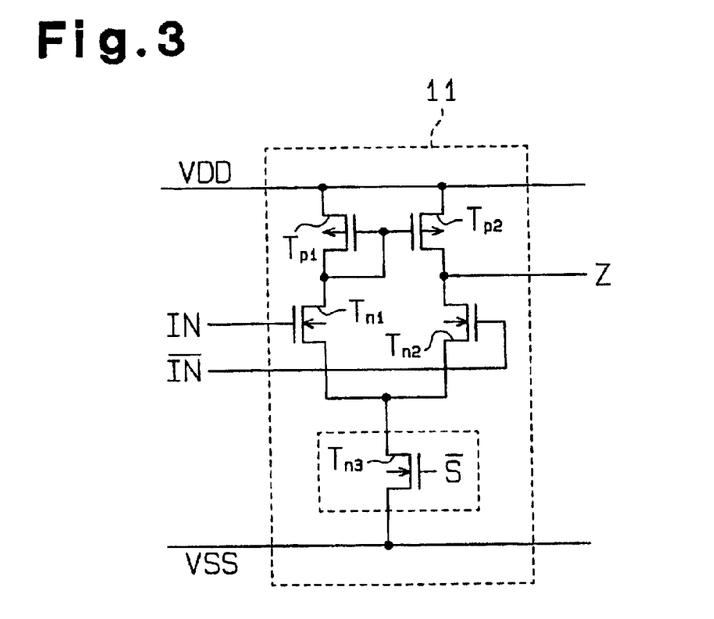
FIG. 3 is a circuit diagram of a differential amplifier circuit according to a second embodiment of the present invention.

The first embodiment may employ another structure to selectively cause a constant current to flow through the NMOS transistor Tn3. As shown in FIG. 3, the differential amplifier 2 may be replaced with a differential amplifier 11 for example, in which the NMOS transistor Tn4 is omitted and the control signal /S is supplied to the gate of the NMOS transistor Tn3. This allows the NMOS transistor Tn3 to serve as a constant current circuit and to selectively disable the differential amplifier circuit 11. Further, this structure reduces the total number of transistors in the input buffer circuit 1 and thus makes the circuit scale of the input buffer circuit 1 smaller.

Third Embodiment

The differential amplifier circuits 2 and 11 may be modified in any form as long as they can inhibit a constant current.

Figure 4:
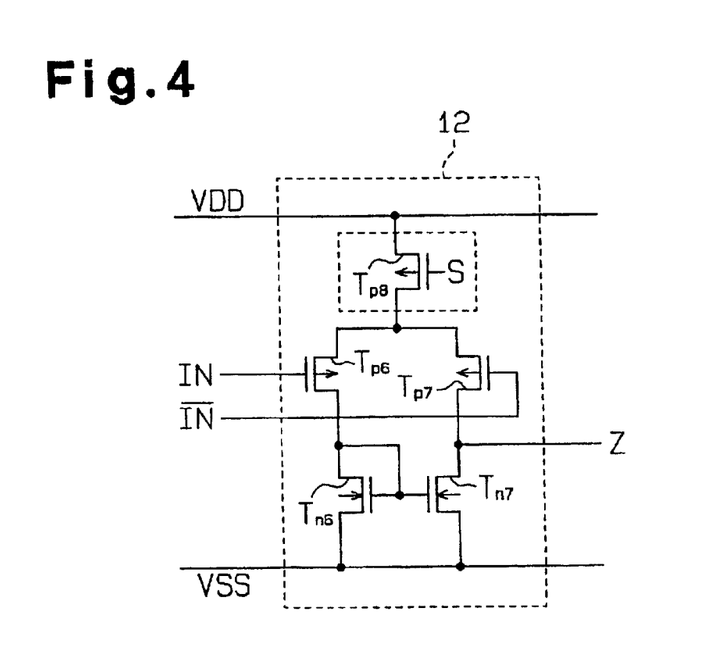
FIG. 4 is a circuit diagram of a differential amplifier circuit according to a third embodiment of the present invention.

As shown in FIG. 4, for example, a differential amplifier circuit 12 employs transistors of the opposite conductivity types to those of the transistors in the differential amplifier circuits 11 and 2. Specifically, NMOS transistors Tn6 and Tn7 form a current mirror section, PMOS transistors Tp6 and Tp7 form a differential amplifier section and a PMOS transistor Tp8 forms a constant current section.

The sources of the PMOS transistors Tp6 and Tp7 are connected together and via the PMOS transistor Tp8 to the high-potential power supply VDD. The drain of the PMOS transistor Tp6 is connected via the NMOS transistor Tn6 to the low-potential power supply VSS. The drain of the PMOS transistor Tp7 is connected via the NMOS transistor Tn7 to the low-potential power supply VSS. The gates of the NMOS transistors Tn6 and Tn7 are connected together and to the drain of the PMOS transistor Tp6.

The control signal S is supplied to the gate of the PMOS transistor Tp8. The input signal IN is supplied to one input terminal of the differential amplifier circuit 12 (the gate of the PMOS transistor Tp6), and the input signal /IN is supplied to the other input terminal of the differential amplifier circuit 12 (the gate of the PMOS transistor Tp7). When the PMOS transistor Tp8 is turned on, the differential amplifier circuit 12 is enabled to amplify the potential difference between the input signals IN and /IN, generating the signal Z, and outputs this signal Z from its output terminal (the drain of the PMOS transistor Tp7).

Fourth Embodiment

Figure 5:
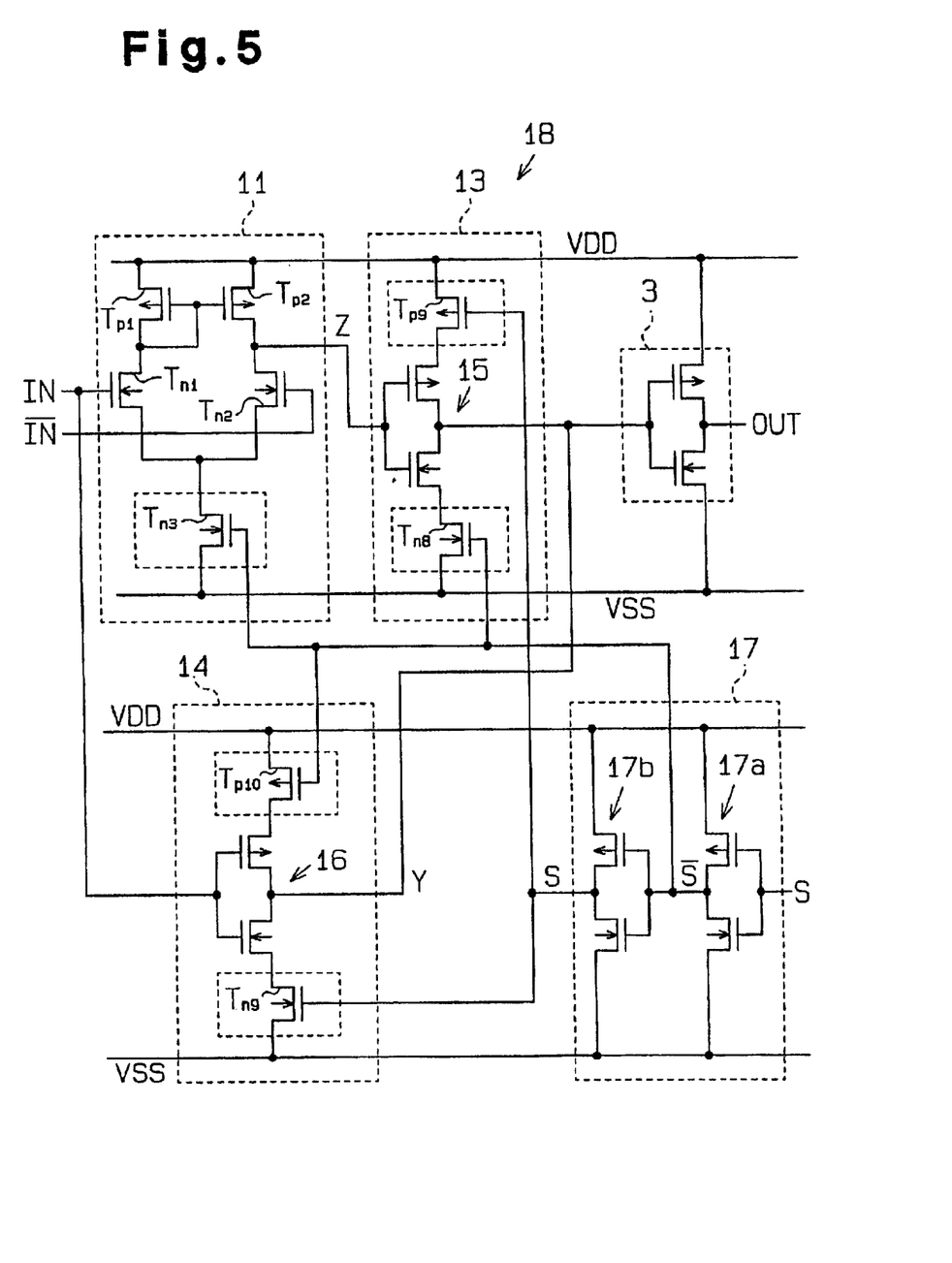
FIG. 5 is a circuit diagram of an input buffer circuit according to a fourth embodiment of the present invention.

FIG. 5 is an input buffer circuit 18 according to a fourth embodiment of the present invention, which includes tri-state inverter circuits 13 and 14 for selecting the signal Z or the signal Y and supplying the selected signal to the driver circuit 3. The tri-state inverter circuits 13 and 14 set their output terminals to a floating state in response to the control signals S and /S to select the signal Z or the signal Y.

Specifically, the tri-state inverter circuit 13 includes an inverter circuit 15 comprising CMOS transistors, a PMOS transistor Tp9 connected between the inverter circuit 15 and the high-potential power supply VDD, and an NMOS transistor Tn8 connected between the inverter circuit 15 and the low-potential power supply VSS. The tri-state inverter circuit 14 includes an inverter circuit 16 comprising CMOS transistors, a PMOS transistor Tp10 connected between the inverter circuit 16 and the high-potential power supply VDD, and an NMOS transistor Tn9 connected between the inverter circuit 16 and the low-potential power supply VSS.

The output terminal of the differential amplifier circuit 11 is connected via the tri-state inverter circuit 13 to the driver circuit 3. The input signal IN is supplied to the input terminal of the tri-state inverter circuit 14 whose output terminal is connected to the driver circuit 3. The tri-state inverter circuit 14 selectively supplies the input signal IN as the signal Y to the driver circuit 3.

A control-signal output circuit 17 includes two series connected inverter circuits 17a, 17b each comprising CMOS transistors. The control-signal output circuit 17 receives the input control signal S. The first-stage inverter circuit 17a supplies the control signal /S to the gates of the NMOS transistors Tn3 and Tn8 and the PMOS transistor Tp10. The second-stage inverter circuit 17b supplies the control signal S (i.e., the same signal level) to the gates of the NMOS transistor Tn9 and the PMOS transistor Tp9.

When the input signals IN and /IN have small amplitudes, the control-signal output circuit 17 receives the input control signal S low. In response to the control signals S and /S from the control-signal output circuit 17, the NMOS transistors Tn3 and Tn8 and the PMOS transistor Tp9 are turned on and the NMOS transistor Tn9 and the PMOS transistor Tp10 are turned off. In response to the ON action of the NMOS transistor Tn3, the differential amplifier circuit 11 is enabled to amplify the potential difference between the input signals IN and /IN, thus generate the signal Z. In response to the OFF actions of the NMOS transistor Tn9 and the PMOS transistor Tp10, the tri-state inverter circuit 14 is disabled.

Since the NMOS transistor Tn8 and the PMOS transistor Tp9 are turned on, the signal Z from the differential amplifier circuit 11 is supplied to the driver circuit 3 via the tri-state inverter circuit 13. The output terminal of the tri-state inverter circuit 14 is left floating.

Therefore, the driver circuit 3 provides the internal circuits with the output signal OUT corresponding to the signal Z from the differential amplifier circuit 11. Thus, the input buffer circuit 18 performs an input operation on the input signals IN and /IN having small amplitudes.

When the input signals IN and /IN have full amplitudes, the control-signal output circuit 17 receives the input control signal S high.

In response to the control signals S and /S from the control-signal output circuit 17, the NMOS transistors Tn3 and Tn8 and the PMOS transistor Tp9 are turned off and the NMOS transistor Tn9 and the PMOS transistor Tp10 are turned on. In response to the ON action of the NMOS transistor Tn9 and the PMOS transistor Tp10, the tri-state inverter circuit 14 is enabled so that the input signal IN is output as the signal Y via the inverter circuit 16. In response to the OFF action of the NMOS transistor Tn3, the differential amplifier circuit 11 is disabled.

At this time, the output terminal of the tri-state inverter circuit 13 is left floating. Therefore, the driver circuit 3 provides the internal circuits with the output signal OUT corresponding to the signal Y from the tri-state inverter circuit 14. Thus, the input buffer circuit 18 performs the input operation on the full-amplitude input signals IN and /IN.

The tri-state inverter circuit 14 selectively supplies the signal Y to the driver circuit 3. The fourth embodiment therefore reduces the total number of transistors in the input buffer circuit 18 and thus makes the circuit scale thereof smaller.

Fifth Embodiment

The present invention may be embodied in an input/output buffer circuit or a bus buffer circuit which is equipped with the input buffer circuit 1. Such an input/output buffer circuit or bus buffer circuit may be used as follows.

Figure 6:
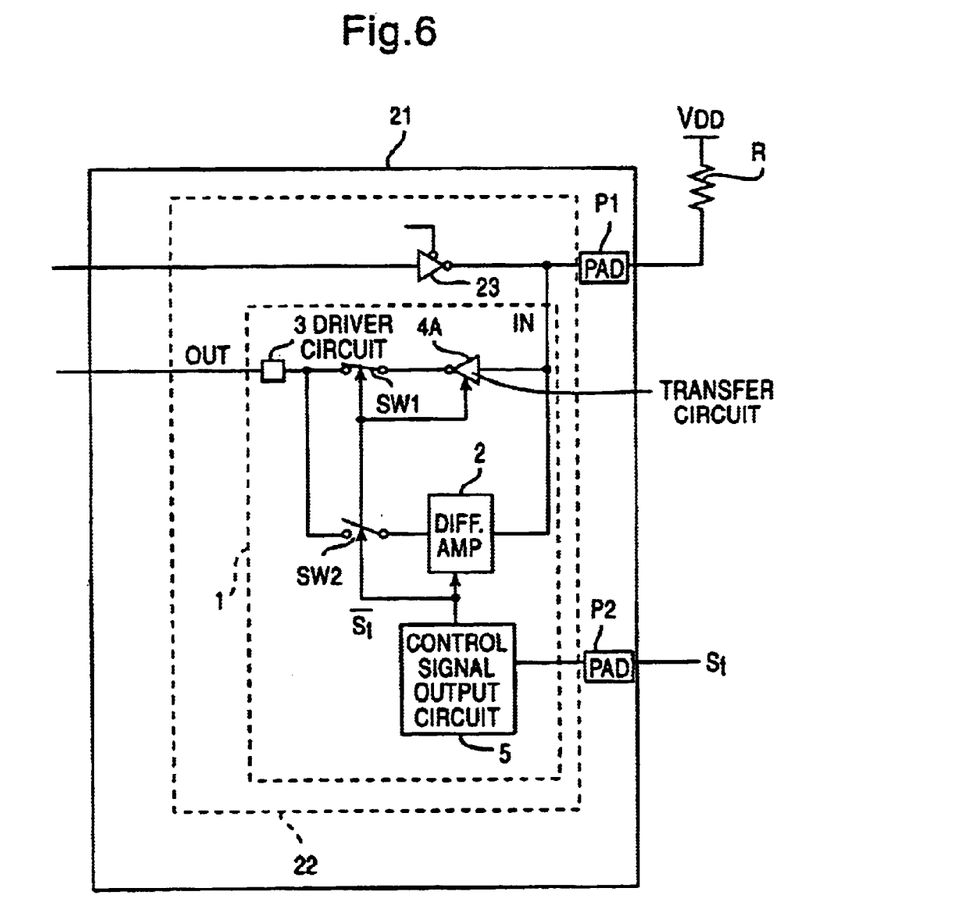
FIG. 6 is a circuit diagram of an input buffer circuit according to a fifth embodiment of the present invention.

As shown in FIG. 6, for example, a semiconductor integrated circuit device 21 has an input/output buffer circuit 22. The input/output buffer circuit 22 includes an output buffer circuit 23 and the input buffer circuit 1. It is to be noted that instead of the complementary input signals IN and /IN, the input signal IN is supplied to one input terminal of the differential amplifier circuit 2 and a constant voltage is supplied to the other input terminal thereof.

When the integrated circuit device 21 is mounted on a printed circuit board, the input buffer circuit 1 receives the input signal IN having a full amplitude. Accordingly, the transfer circuit 4A is used in the normal usage. The input buffer circuit 1 receives an input control signal St high via a pad P2. As a result, a control signal /St low is supplied to the gates of the NMOS transistors Tn4 and Tn5 and the PMOS transistors Tp3–Tp5 of FIG. 2. The transfer circuit 4A is enabled and the input operation for the full-amplitude input signal IN is carried out with low power consumption.

Switch SW1 is closed while switch SW2 is open.

The output buffer circuit 23 provides a signal from the internal circuits to an external circuit via a pad P1.

An operation test of the integrated circuit device 21 is conducted before delivery, which includes an operation test of the output buffer circuit 23.

In an input/output buffer circuit which has a high output impedance and a low drive performance, the output waveform is disturbed by a reflection phenomenon originating from an impedance mismatch with the impedance of the testing apparatus, preventing adequate testing. In testing the operations of such a buffer circuit, therefore, the output waveform should be shaped using a terminal resistor.

In the operational test, first, a terminal resistor R is connected to the pad P1, then the signal output from the output buffer circuit 23 is observed to determine whether the output buffer circuit 23 is normal or is failing.

The value of the terminal resistor R (e.g., 50Ω) in the operational test does not often match the resistance in the actual use (i.e., the output impedance at the time a user uses the input/output buffer circuit 22). Therefore, the rising of the input signal IN supplied to the input buffer circuit 1 is delayed and the level becomes unstable due to the mismatched impedance. Further, the amplitude of the input signal IN is reduced by the influence of the terminal resistor R. When the input signal IN is supplied via the output buffer circuit 23 to the input buffer circuit 1 by the operational test, therefore, an unstable output signal OUT is provided to the internal circuit, so that an adequate operational test is not carried out.

In operational test mode, therefore, the low input control signal St is supplied to the control-signal output circuit 5 via the pad P2, thus enabling the differential amplifier circuit 2. At this time, the transfer circuit 4 is disabled. Consequently, the input signal IN output from the output buffer circuit 23 is supplied via the differential amplifier circuit 2 to the internal circuit as a full-amplitude signal. This permits the operational test on the output buffer circuit 23 to be executed properly.

That is, in operational test mode, the proper operational test on the output buffer circuit 23 is performed by enabling the differential amplifier circuit 2. When a user uses the input/output buffer circuit 22, on the other hand, the consumed power of the input buffer circuit 1 is reduced by enabling the transfer circuit 4A. In the case of a bus buffer circuit, the use of the above-described schemes provides the same advantages. In the fifth embodiment, the input buffer circuit 1 may be changed to the input buffer circuit 18.

It should be apparent to those skilled in the art that the present invention may be embodied in many other specific forms without departing from the spirit or scope of the invention. Particularly, it should be understood that the invention may be embodied in the following forms.

A plurality of differential amplifier circuits 2, 11 or 12 may be used. In this case, when the input signals IN and /IN have full amplitudes, the consumed power is further reduced.

It is effective to use the input buffer circuit in each of the above-described individual embodiments when the amplitudes of the input signals IN and /IN are set to small amplitudes or full amplitudes depending on the state of the usage (the state where the integrated circuit device is mounted on a board). In addition, the input signals IN and /IN may always have small amplitudes.

The present examples and embodiments are to be considered as illustrative and not restrictive and the invention is not to be limited to the details given herein, but may be modified within the scope and equivalence of the appended claims.

What is claimed is:

1. An input buffer circuit comprising:
   a differential amplifier circuit, disposed between a first power supply and a second power supply, for receiving first and second input signals and generating an amplified signal corresponding to a voltage difference between the first and second input signals;
   a first circuit, coupled to the differential amplifier circuit, for receiving the amplified signal from the differential amplifier circuit;
   a second circuit, including a first inverter and a MOS transistor, disposed between the first power supply and the second power supply, for receiving the first input signal; and a control circuit for selectively enabling one of the differential amplifier circuit and the second circuit in accordance with a control signal while isolating the other one of the differential amplifier circuit and the second circuit from at least one of the first power supply and the second power supply.

2. The input buffer circuit according to claim 1, wherein the control circuit enables the differential amplifier circuit and disables the second circuit when the first and second Input signals have amplitudes smaller than a predetermined voltage.

3. The input buffer circuit according to claim 1, wherein the control circuit disables the differential amplifier circuit and enables the second circuit when the first and second input signals have amplitudes greater than a predetermined voltage.

4. The input buffer circuit according to claim 1, wherein each of the first and second circuits includes only one output terminal.

5. The input buffer circuit according to claim 1, wherein the first circuit includes a second inverter.

6. The input buffer circuit according to claim 1, wherein the MOS transistor is a PMOS transistor and is connected between the first inverter and the first power supply.

7. The input buffer circuit according to claim 1, wherein the MOS transistor is an NMOS transistor and is connected between the first inverter and the second power supply.

8. The input buffer circuit according to claim 1, wherein the first circuit receives an output signal from the enabled one of the differential amplifier circuit and the second circuit.

9. An input buffer circuit comprising:
a differential amplifier circuit for receiving first and second input signals and generating an amplified signal corresponding to a voltage difference between the first and second input signals;
a first circuit, connected to the differential amplifier circuit, for receiving the amplified signal from the differential amplifier circuit;
a second circuit, including an inverter and a MOS transistor, for receiving the first input signal; and
a control circuit for selectively enabling the differential amplifier circuit and the second circuit in accordance with a control signal, wherein the control circuit enables the differential amplifier circuit and disables the second circuit when the first and second input signals have amplitudes smaller than a predetermined voltage.

10. The input buffer circuit according to claim 9, wherein the control circuit disables the differential amplifier circuit and enables the second circuit when the first and second input signals have amplitudes greater than the predetermined voltage.

11. The input buffer circuit according to claim 9, wherein the differential amplifier circuit includes a constant current source, and wherein the control circuit disables the differential amplifier circuit by stopping a current from flowing through the constant current source.

12. An input buffer circuit comprising:
a differential amplifier circuit for receiving first and second input signals and generating an amplified signal corresponding to a voltage difference between the first and second input signals;
a first circuit, connected to the differential amplifier circuit, for receiving the amplified signal from the differential amplifier circuit;
a second circuit, including an inverter and a MOS transistor, for receiving the first input signal; and
a control circuit for selectively enabling the differential amplifier circuit and the second circuit in accordance with a control signal, wherein the control circuit disables the differential amplifier circuit and enables the second circuit when the first and second input signals have amplitudes greater than a predetermined voltage.

13. The input buffer circuit according to claim 12, wherein the control circuit enables the differential amplifier circuit and disables the second circuit when the first and second input signals have amplitudes smaller than the predetermined voltage.

14. The input buffer circuit according to claim 12, wherein the differential amplifier circuit includes a constant current source, and wherein the control circuit disables the differential amplifier circuit by stopping a current from flowing through the constant current source.

15. An input buffer circuit comprising:
a differential amplifier circuit for receiving first and second input signals and generating an amplified signal corresponding to a voltage difference between the first and second input signals;
a first circuit, connected to the differential amplifier circuit, for receiving the amplified signal from the differential amplifier circuit;
a second circuit, including a first inverter and a plurality of MOS transistors, for receiving the first input signal; and
a control circuit for selectively enabling the differential amplifier circuit and the first and second circuits in accordance with a control signal, wherein the differential amplifier circuit and the first circuit are enabled and the second circuit is disabled when the first and second input signals have amplitudes smaller than a predetermined voltage.

16. The input buffer circuit according to claim 15, wherein the control circuit disables the differential amplifier circuit and the first circuit and enables the second circuit when the first and second input signals have amplitudes greater than the predetermined voltage.

17. The input buffer circuit according to claim 15, further comprising a driver circuit, connected to the first and second circuits, for receiving an output signal from the enabled one of the first and second circuits enabled by the control circuit.

18. The input buffer circuit according to claim 15, wherein the first circuit includes:
a second inverter;
a first PMOS transistor connected between the second inverter and a high-potential power supply; and
a first NMOS transistor connected between the second inverter and a low-potential power supply, and
wherein the plurality of MOS transistors include:
a second PMOS transistor connected between the first inverter and the high-potential power supply; and
a second NMOS transistor connected between the first inverter and the low-potential power supply.

19. The input buffer circuit according to claim 18, wherein the control circuit generates first and second control signals which are complementary to each other, and wherein the first PMOS transistor of the first circuit and the second NMOS transistor of the second circuit are controlled by the first control signal, and the first NMOS transistor of the first circuit and the second PMOS transistor of the second circuit are controlled by the second control signal.

20. The input buffer circuit according to claim 15, wherein each of the first and second circuits includes only one output terminal.

21. The input buffer circuit according to claim 15, wherein the first circuit includes:
a second inverter; and
a PMOS transistor connected between the second inverter and a high-potential power supply.

22. The input buffer circuit according to claim 15, wherein the first circuit includes:
a second inverter; and
an NMOS transistor connected between the second inverter and a low-potential power supply.

23. The input buffer circuit according to claim 15, wherein one of the plurality of MOS transistors is a PMOS transistor connected between the first inverter and a high-potential power supply.

24. The input buffer circuit according to claim 15, wherein one of the plurality of MOS transistors is an NMOS transistor connected between the first inverter and a low-potential power supply.

25. An input buffer circuit comprising:
a differential amplifier circuit for receiving first and second input signals and generating an amplified signal corresponding to a voltage difference between the first and second Input signals;
a first circuit, connected to the differential amplifier circuit, for receiving the amplified signal from the differential amplifier circuit;
a second circuit, including a first inverter and a plurality of MOS transistors, for receiving the first input signal; and
a control circuit, connected to the differential amplifier circuit and the first and second circuits, for selectively enabling the differential amplifier circuit and the first and second circuits in accordance with a control signal, wherein the differential amplifier circuit and the first circuit are disabled and the second circuit is enabled when the first and second input signals have amplitudes greater than a predetermined voltage.

26. The input buffer circuit according to claim 25, wherein the control circuit enables the differential amplifier circuit and the first circuit and disables the second circuit when the first and second input signals have amplitudes smaller than the predetermined voltage.

27. The input buffer circuit according to claim 25, further comprising a driver circuit, connected to the first and second circuits, for receiving an output signal from the enabled one of the first and second circuits enabled by the control circuit.

28. The input buffer circuit according to claim 25, wherein the first circuit includes:
a second inverter;
a first PMOS transistor connected between the second inverter and a high-potential power supply; and
a first NMOS transistor connected between the second inverter and a low-potential power supply, and
wherein the plurality of MOS transistors include:
a second PMOS transistor connected between the first inverter and the high-potential power supply; and
a second NMOS transistor connected between the first inverter and low-potential power supply.

29. The input buffer circuit according to claim 28, wherein the control circuit generates first and second control signals which are complementary to each other, and wherein the first PMOS transistor of the first circuit and the second NMOS transistor of the second circuit are controlled by the first control signal, and the first NMOS transistor of the first circuit and the second PMOS transistor of the second circuit are controlled by the second control signal.

30. An input buffer circuit comprising:
a differential amplifier circuit for receiving first and second input signals and generating an amplified signal corresponding to a voltage difference between the first and second input signals;
a first circuit, disposed between a first power supply and a second power supply, for receiving the amplified signal from the differential amplifier circuit;
a second circuit, including an inverter and a MOS transistor and disposed between the first power supply and the second power supply, for receiving the first input signal; and
a control circuit, coupled to the differential amplifier circuit and the first and second circuits; for selectively enabling the differential amplifier circuit and one of the first circuit and the second circuit in accordance with a control signal while isolating the other one of the first circuit and the second circuit from the first power supply or the second power supply.

31. The input buffer circuit according to claim 30, wherein the control circuit isolates the first circuit from the first power supply or the second power supply when the first and second input signals have amplitudes smaller than a predetermined voltage.

32. The input buffer circuit according to claim 30, wherein the control circuit isolates the second circuit from the first power supply or the second power supply when the first and second input signals have amplitudes greater than a predetermined voltage.

33. The input buffer circuit according to claim 30, wherein the control circuit enables the differential amplifier circuit and the first circuit and disables the second circuit when the first and second input signals have amplitudes smaller than a predetermined voltage.

34. The input buffer circuit according to claim 30, wherein the control circuit disables the differential amplifier circuit and the first circuit and enables the second circuit when the first and second input signals have amplitudes greater than a predetermined voltage.

35. The input buffer circuit according to claim 30, wherein the MOS transistor is a PMOS transistor and is connected between the inverter and the first power supply.

36. The input buffer circuit according to claim 30, wherein the MOS transistor is an NMOS transistor and is connected between the inverter and the second power supply.

37. An input buffer circuit comprising:
a differential amplifier circuit, disposed between a first power supply and a second power supply, for receiving first and second input signals and generating an amplified signal corresponding to a voltage difference between the first and second input signals;
a first circuit, coupled to the differential amplifier circuit, for receiving the amplified signal from the differential amplifier circuit;
a second circuit, including an inverter and a MOS transistor and disposed between the first power supply and the second power supply, for receiving the first input signal and generating an output signal to the first circuit; and
a control circuit for selectively enabling one of the differential amplifier circuit and the second circuit in accordance with a control signal and disabling the other one of the differential amplifier circuit and the second circuit in accordance with the control signal.

38. An input buffer circuit comprising:

a differential amplifier circuit, disposed between a first power supply and a second power supply, for receiving first and second input signals and generating an amplified signal corresponding to a voltage difference between the first and second input signals;

a first circuit, coupled to the differential amplifier circuit, for receiving the amplified signal from the differential amplifier circuit;

a second circuit, including an inverter and a MOS transistor and disposed between the first power supply and the second power supply, for receiving the first input signal and generating an output signal to the first circuit; and a control circuit for selectively isolating one of the differential amplifier circuit and the second circuit from at least one of the first power supply and the second power supply while enabling the other one of the differential amplifier circuit and the second circuit.

39. An input buffer circuit comprising:

a differential amplifier circuit, disposed between a first power supply and a second power supply, for receiving first and second input signals and generating an amplified signal corresponding to a voltage difference between the first and second input signals;

a first circuit, coupled to the differential amplifier circuit, for receiving the amplified signal from the differential amplifier circuit;

a second circuit, including an inverter and a MOS transistor and disposed between the first power supply and the second power supply, for receiving the first input signal and generating an output signal to the first circuit; and a control circuit for selectively enabling one of the differential amplifier circuit and the second circuit in accordance with a control signal while isolating the other one of the differential amplifier circuit and the second circuit from at least one of the first power supply and the second power supply.

40. An input buffer circuit comprising:

a differential amplifier circuit, disposed between a first power supply and a second power supply, for receiving first and second input signals and generating a single amplified signal corresponding to a voltage difference between the first and second input signals;

a first circuit, coupled to the differential amplifier circuit, for receiving the amplified signal from the differential amplifier circuit;

a second circuit, including an inverter and a MOS transistor and disposed between the first power supply and the second power supply, for receiving the first input signal and generating a single output signal to the first circuit; and a control circuit for selectively enabling one of the differential amplifier circuit and the second circuit in accordance with a control signal and disabling the other one of the differential amplifier circuit and the second circuit in accordance with the control signal.

41. An input buffer circuit comprising:

a differential amplifier circuit, disposed between a first power supply and a second power supply, for receiving first and second input signals and generating a single amplified signal corresponding to a voltage difference between the first and second input signals;

a first circuit, coupled to the differential amplifier circuit, for receiving the amplified signal from the differential amplifier circuit;

a second circuit, including an inverter and a MOS transistor and disposed between the first power supply and the second power supply, for receiving the first input signal and generating a single output signal to the first circuit; and a control circuit for selectively isolating one of the differential amplifier circuit and the second circuit from at least one of the first power supply and the second power supply while enabling the other one of the differential amplifier circuit and the second circuit.

* * * * *